United States Patent
Lee et al.

(10) Patent No.: US 8,045,404 B2
(45) Date of Patent: Oct. 25, 2011

(54) SEMICONDUCTOR MEMORY DEVICE CAPABLE OF PREVENTING DAMAGE TO A BITLINE DURING A DATA MASKING OPERATION

(75) Inventors: Byung-Hyun Lee, Seongnam-si (KR); Byung-Sik Moon, Seoul (KR); Seung-Bum Ko, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 90 days.

(21) Appl. No.: 12/660,439

(22) Filed: Feb. 26, 2010

(65) Prior Publication Data

US 2010/0226187 A1    Sep. 9, 2010

(30) Foreign Application Priority Data

Mar. 6, 2009 (KR) .................. 10-2009-0019359

(51) Int. Cl.
*G11C 7/10* (2006.01)

(52) U.S. Cl. ......... 365/189.17; 365/189.14; 365/189.15; 365/189.16; 365/190; 365/203; 365/228

(58) Field of Classification Search ............. 365/189.14, 365/189.15, 189.16, 189.17, 190, 189.02, 365/203, 228, 226
See application file for complete search history.

(56) References Cited

U.S. PATENT DOCUMENTS

| | | | | |
|---|---|---|---|---|
| 5,982,693 | A * | 11/1999 | Nguyen | 365/208 |
| 6,798,704 | B2 * | 9/2004 | Chen et al. | 365/205 |
| 7,154,796 | B2 | 12/2006 | Lee et al. | |
| 7,248,517 | B2 | 7/2007 | Lee et al. | |
| 7,420,861 | B2 | 9/2008 | Lee et al. | |
| 7,668,026 | B2 * | 2/2010 | Kyung et al. | 365/194 |
| 2005/0146957 | A1 | 7/2005 | Lee et al. | |
| 2006/0120182 | A1 | 6/2006 | Lee et al. | |
| 2007/0070749 | A1 | 3/2007 | Lee et al. | |

FOREIGN PATENT DOCUMENTS

| | | |
|---|---|---|
| JP | 2001-067876 A | 3/2001 |
| JP | 2005-196961 A | 7/2005 |
| KR | 10-0583959 B1 | 5/2006 |
| KR | 10-0597791 B1 | 6/2006 |

* cited by examiner

*Primary Examiner* — Andrew Q Tran
(74) *Attorney, Agent, or Firm* — Onello & Mello, LLP

(57) ABSTRACT

A semiconductor memory device includes a memory cell array having a plurality of memory cells coupled between a plurality of word lines and a plurality of bit line pairs, a bit line selection circuit configured to transmit data between a selected bit line pair and a local input/output line pair in response to a column selection signal, a local global input/output gate circuit configured to transmit data between the local input/output line pair and a global input/output line pair in response to a local global input/output selection signal, and a controller configured to drive the word lines, output the column selection signal having a first voltage level to the bit line selection circuit, and output the local global input/output selection signal having a second voltage level that is lower than the first voltage level to the local global input/output gate circuit, in response to an external address signal and an external command.

10 Claims, 2 Drawing Sheets

SEMICONDUCTOR MEMORY DEVICE CAPABLE OF PREVENTING DAMAGE TO A BITLINE DURING A DATA MASKING OPERATION

CROSS-REFERENCE TO RELATED APPLICATION

This application claims priority under 35 U.S.C. §119 from Korean Patent Application No. 10-2009-0019359, filed on Mar. 6, 2009, the contents of which are hereby incorporated herein by reference in its entirety.

BACKGROUND

1. Field

Embodiments relate to a semiconductor memory device and, more particularly, to a semiconductor memory device having a data input/output circuit to prevent damage to a bit line during a data masking operation.

2. Description of Related Art

Semiconductor memory devices can permit a data masking operation to be performed to prevent undesired data from being read or written. In general, if the data masking operation is activated during a write operation, a controller of the semiconductor memory device blocks a data transmission control signal that controls an input/output driver driving a global input/output line, but a column selection signal and a local global input/output control signal are nevertheless output, which may damage bit lines of the device during the data masking operation.

SUMMARY

Preferred embodiments provide a semiconductor memory device that prevents damage to a bit line that may occur during a data masking operation.

In accordance with an aspect, a semiconductor memory device includes: a memory cell array having a plurality of memory cells coupled between a plurality of word lines and a plurality of bit line pairs, each memory cell of the plurality of memory cells coupled between at least one word line of the plurality of word lines and a bit line of at least one bit line pair of the plurality of bit line pairs; a bit line selection circuit configured to transmit data between a selected bit line pair of the plurality of bit line pairs and a local input/output line pair in response to a column selection signal; a local global input/output gate circuit configured to transmit data between the local input/output line pair and a global input/output line pair in response to a local global input/output selection signal; and a controller configured to drive the word lines, output the column selection signal having a first voltage level to the bit line selection circuit, and output the local global input/output selection signal having a second voltage level that is lower than the first voltage level to the local global input/output gate circuit, in response to an external address signal and an external command.

In an embodiment, the bit line selection circuit includes a plurality of bit line selection gates coupled between each of the bit line pairs and each of the local input/output line pairs, and each having a gate to which the column selection signal is applied.

In an embodiment, the local global input/output gate circuit includes a plurality of local global input/output gates coupled between each of the local input/output line pairs and each of the global input/output line pairs, and each having a gate to which the local global input/output selection signal is applied.

In an embodiment, the bit line selection gates and the local global input/output gates are transistors having a same conductivity type.

In an embodiment, a threshold voltage of the local global input/output gates is lower than a threshold voltage of the bit line selection gates, and a difference between the first voltage and the second voltage may be smaller than a difference between the threshold voltage of the local global input/output gates and the threshold voltage of the bit line selection gates.

In an embodiment, the first voltage is an internal power supply voltage and the second voltage is an array internal power supply voltage.

In an embodiment, the semiconductor memory device further includes a precharge circuit configured to precharge the global input/output line pair to a third voltage in response to a precharge signal, and an input/output line driver circuit configured to drive the global input/output line pair in response to a data transfer control signal and external data during a write operation, and configured such that an output terminal is floated when the data transfer control signal is deactivated during a data masking operation.

In an embodiment, the controller of the semiconductor memory device outputs the precharge signal and the data transfer control signal in response to the address signal and the command.

In an embodiment, the controller of the semiconductor memory device includes a decoder configured to decode the address signal and the command, and output a column selection control signal and a local global input/output control signal; a column selection signal driver connected between the first voltage and a ground voltage, and configured to output the column selection signal in response to the column selection control signal; and a local global input/output selection signal driver connected between the second voltage and the ground voltage, and configured to output the local global input/output selection signal in response to the local global input/output control signal.

In an embodiment, the first and third voltages of the semiconductor memory device are internal power supply voltages and the second voltage is an array internal power supply voltage.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
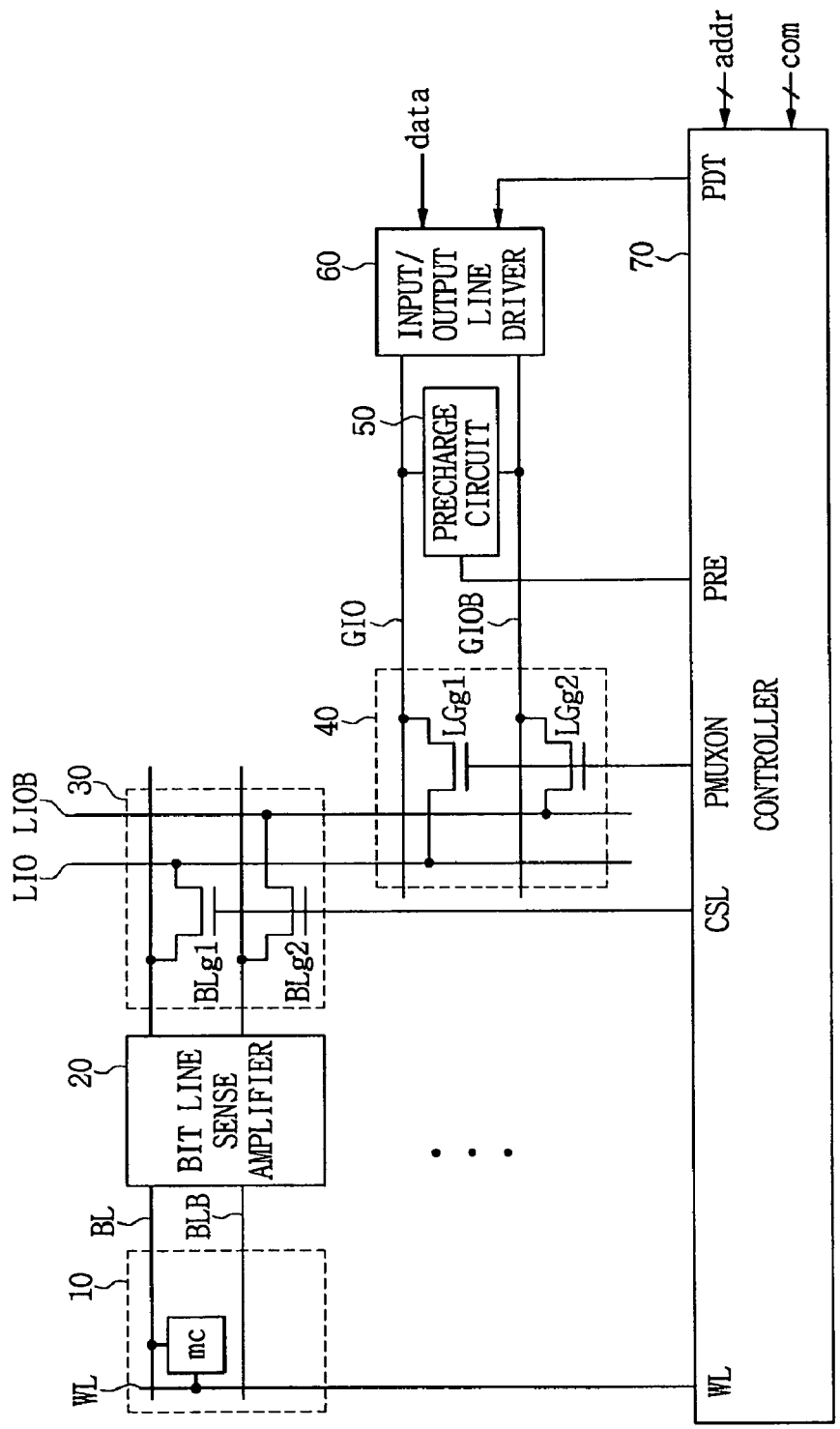
FIG. 1 illustrates the configuration of a semiconductor memory device according to an embodiment.

Various example embodiments will now be described more fully with reference to the accompanying drawings in which some example embodiments are shown. In the drawings, the thicknesses of layers and regions may be exaggerated for clarity. Detailed illustrative embodiments are disclosed herein. However, specific structural and functional details disclosed herein are merely representative for purposes of describing example embodiments. The inventive concepts, however, may be embodied in many alternate forms and should not be construed as limited to only example embodiments set forth herein.

As used herein, the singular forms "a," "an" and "the" are intended to include the plural forms as well, unless the context clearly indicates otherwise. It will be further understood that the terms "comprises," "comprising," "includes," "including," "has," and/or "having," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Although the terms first, second, and the like may be used in this specification to describe respective components or sections, these terms are used for clear description and these components or sections are not limited by these terms. The thicknesses and relative thicknesses of components shown in each drawing may be exaggerated to clearly describe the exemplary embodiments of the present inventive concepts.

Hereinafter, a semiconductor memory device according to example embodiments will be described with reference to the accompanying drawings.

FIG. 1 illustrates the configuration of a semiconductor memory device according to an embodiment.

As shown in FIG. 1, the semiconductor memory device includes a memory cell array 10, a bit line sense amplifier 20, a bit line selection circuit 30, a local global input/output gate circuit 40, a precharge circuit 50, an input/output line driver 60, and a controller 70.

Operations of each block of FIG. 1 will now be described as follows.

In an embodiment, as shown in FIG. 1, the memory cell array 10 includes a memory cell MC coupled between a word line WL and a bit line BL. In other embodiments, the memory cell array 10 includes a plurality of memory cells MC connected between word lines WL and bit lines BL or complementary bit lines BLB, and reads or writes data from or to a selected memory cell of the plurality of memory cells MC.

The bit line sense amplifier 20 amplifies a voltage or current difference between a bit line BL and a complementary bit line BLB, so that data stored in the selected memory cell is amplified.

The bit line selection circuit 30 can include bit line selection gates BLg1 and BLg2, each having a gate to which a column selection signal CSL is applied, and each connected between a bit line BL and a local input/output line LIO, and/or a complementary bit line BLB and a complementary local input/output line LIOB. In this manner, data can be transmitted between the bit line BL and the local input/output line LIO and the complementary bit line BLB and the complementary local input/output line LIOB in response to the column selection signal CSL output from the controller 70. In an embodiment, the bit line selection circuit 30 may be configured to transmit data between the selected bit line pair BL and BLB and the selected local input/output lines LIO and LIOB, when the column selection signal CSL having a first voltage is output from the controller 70. In an embodiment, the first voltage is a voltage that is sufficient to activate bit line selection gates BLg1, BLg2. In an embodiment, the first voltage can be an internal power supply voltage of a semiconductor memory device.

The local global input/output gate circuit 40 can comprise local global input/output gates LGg1 and LGg2, each having a gate to which a local global input/output selection signal PMUXON is applied. Gate LGg1 can be connected between the local input/output line LIO and a global input/output line GIO and gate LGg2 can be connected between the complementary local input/output line LIOB and a complementary global input/output line GIOB. Gates LGg1, LGg2 can transmit data between the local input/output line LIO and the global input/output line GIO and the complementary local input/output line LIOB and the complementary global input/output line GIOB in response to the local global input/output selection signal PMUXON output from the controller 70. In an embodiment, the bit line selection circuit 30 can be configured to transmit data between the local input/output line pair LIO and LIOB and the global input/output line pair GIO and GIOB when the local global input/output selection signal PMUXON is output from the controller 70 having a second voltage lower than the first voltage, for example, an internal power supply voltage. In an embodiment, the second voltage is a voltage that is sufficient to activate the local global input/output gates LGg1, LGg2. In an embodiment, the second voltage may be an array internal power supply voltage of a semiconductor memory device. Additionally, each of the local global input/output gates LGg1 and LGg2 of the local global input/output gate circuit 40 can include transistors having a lower threshold voltage than a threshold voltage of the bit line selection gates BLg1 and BLg2. In this case, a voltage difference between the first voltage and the second voltage can be configured to be smaller than a voltage difference between a threshold voltage of the local global input/output gates LGg1 and LGg2 and a threshold voltage of the bit line selection gates BLg1 and BLg2.

The precharge circuit 50 precharges the global input/output line GIO and the complementary global input/output line GIOB to a predetermined voltage level in response to a precharge signal PRE applied from the controller 70. The precharge voltage may have a high level, i.e., an internal power supply voltage level.

The input/output line driver 60 drives a pair of global input/output lines GIO and GIOB in response to external data and a data transfer control signal PDT applied from the controller 70 during a write operation. Additionally, output terminals of the input/output line driver 60 are floated in response to the data transfer control signal PDT deactivated during a data masking operation.

The controller 70 drives a selected word line, and outputs the column selection signal CSL, the local global input/output selection signal PMUXON, the precharge signal PRE and the data transfer control signal PDT in response to an external address signal addr and an external command signal com. Additionally, the controller 70 deactivates the data transfer control signal PDT in response to the address signal addr and the command signal com during the data masking operation. In other words, the controller 70 can be configured to activate the column selection signal CSL to the first voltage and the local global input/output selection signal PMUXON to the second voltage in response to the address signal addr and the command signal com. As described above, in an embodiment, the first voltage can be an internal power supply voltage and the second voltage can be an array internal power supply voltage.

Figure 2:
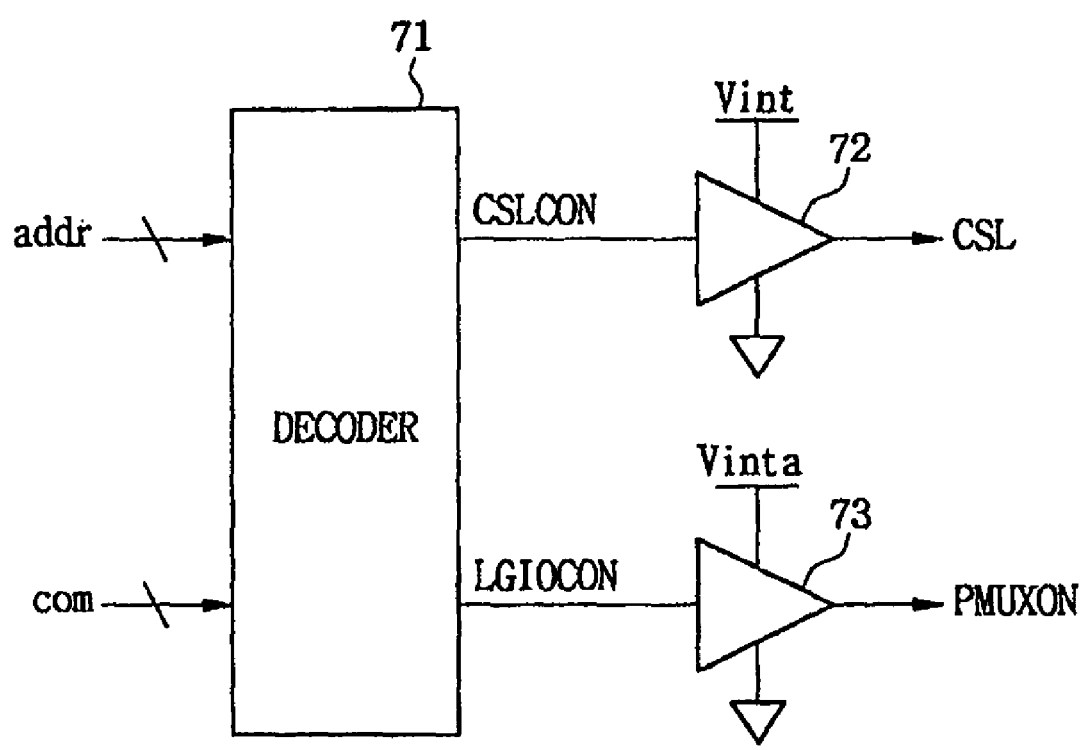
FIG. 2 illustrates a partial configuration of a controller of the semiconductor memory device of FIG. 1.

FIG. 2 illustrates a partial configuration of the controller 70 of the semiconductor memory device of FIG. 1. In particular, FIG. 2 illustrates parts of the controller 70 that generate a column selection signal CSL and a local global input/output selection signal PMUXON in the controller 70. In an embodiment, the controller 70 can be configured to include a decoder 71, a column selection signal driver 72 and a local global selection signal driver 73.

The structural details, function, and operation of each element of FIG. 2 will be described as follows.

The decoder 71 outputs a column selection control signal CSLCON and a local global selection control signal LGIOCON in response to an external address signal addr and an external command signal com. In an embodiment, the decoder 71 decodes an external column address signal, and outputs the column selection control signal CSLCON to drive a selected column selection signal line. The decoder 71 can also be configured to output the local global selection control signal LGIOCON to drive a local global selection signal line by decoding an external command, for example, command signal com.

The column selection signal driver 72 is connected between an internal power supply voltage Vint and a ground voltage, and outputs the column selection signal CSL in response to the column selection control signal CSLCON. In an embodiment, the column selection signal driver 72 can activate the column selection signal CSL to be at a level of the internal power supply voltage in response to the column selection control signal CSLCON, and/or deactivate the column selection signal CSL to be at a level of the ground voltage.

The local global selection signal driver 73 is connected between an array internal power supply voltage Vinta and the ground voltage, and outputs the local global input/output selection signal PMUXON in response to the local global selection control signal LGIOCON. In an embodiment, the array internal power supply voltage Vinta can have a lower voltage than the internal power supply voltage Vint. In an embodiment, the local global selection signal driver 73 may activate the local global input/output selection signal PMUXON to a level of the array internal power supply voltage Vinta in response to the local global selection control signal LGIOCON, and/or deactivate the local global input/output selection signal PMUXON to a level of the ground voltage.

In FIG. 2, the column selection signal driver 72 outputs the column selection signal CSL at a level of the internal power supply voltage Vint, and the local global selection signal driver 73 outputs the local global input/output selection signal PMUXON at a level of the array internal power supply voltage Vinta. On the other hand, the column selection signal driver 72 can be configured to output the column selection signal CSL at a level of the first voltage, and the local global selection signal driver 73 can output the local global input/output selection signal PMUXON at a level of the second voltage that is lower than the first voltage. Also, as described above, a voltage difference between the first voltage and the second voltage may be configured to be less than a voltage difference between a threshold voltage of the local global input/output gates LGg1 and LGg2 and a threshold voltage of the bit line selection gates BLg1 and BLg2.

As described above, when a data masking operation is performed, the data transfer control signal PDT is deactivated, but the column selection signal CSL and the local global input/output selection signal PMUXON are normally output. In an embodiment, before the data masking operation is performed, the global input/output line pairs GIO/GIOB are precharged to a predetermined level, e.g., to a level at or about a level of an internal power supply voltage Vint, and the data transfer control signal PDT is deactivated during the data masking operation. Thus, output terminals of the input/output line driver 60 are in a floating state. In this state, when the column selection signal CSL and the local global input/output selection signal PMUXON are activated, most of a precharged voltage, e.g., an internal power supply voltage Vint, of the global input/output line pairs GIO/GIOB is provided to the bit line pairs BL and BLB, whereby the bit line BL and the complementary bit line BLB may be damaged.

The semiconductor memory device according to preferred embodiments activates the local global input/output selection signal PMUXON at a low voltage level, so that a precharged voltage, e.g., an internal power supply voltage Vint, of the precharged global input/output line pairs GIO/GIOB may be transferred with a relatively small voltage to the bit line pairs BL and BLB, and thus preventing damage to the bit lines BL and BLB.

In preferred embodiments, the threshold voltage of the local global input/output gates LGg1 and LGg2 is lower than the threshold voltage of the bit line selection gates BLg1 and BLg2. Accordingly, a voltage level of the local global input/output selection signal PMUXON, which controls the local global input/output gates LGg1 and LGg2 can be lower than a voltage level of the column selection signal CSL, which controls the bit line selection gates BLg1 and BLg2. However, if the voltage level of the local global input/output selection signal PMUXON is excessively low, write operation problems may occur, more particularly, with regard to writing speed.

According to the following, if the threshold voltage of the bit line selection gates BLg1 and BLg2 is Vtcsl, a threshold voltage of the local global input/output gates LGg1 and LGg2 is Vtpmuxon, a voltage of the activated column selection signal CSL is Vcsl, and a voltage of the activated local global input/output selection signal PMUXON is Vpmuxon. Thus, a voltage Vlio to drive the local input/output line pairs LIO and LIOB and a voltage Vbl to drive the bit line pairs BL and BLB can be described mathematically as follows:

$$Vlio = Vpmuxon - Vtpmuxon$$

$$Vbl = Vcsl - Vtcsl \qquad \text{Expression 1}$$

At this time, if the voltage Vlio that drives the local input/output line pairs LIO and LIOB is greater than the voltage Vbl that drives the bit line pairs BL and BLB, the level of the voltage Vbl that drives the bit line pairs BL and BLB is not affected even when the voltage Vpmuxon of the local global input/output selection signal PMUXON is low. This can be represented by the following mathematical expression 2.

$$Vpmuxon - Vtpmuxon > Vcsl - Vtcsl \qquad \text{Expression 2}$$

Accordingly, if the following mathematical expression 3 is satisfied, the level of the voltage Vbl that drives the bit line pairs BL and BLB is not affected even when the voltage of the local global input/output selection signal PMUXON is low.

$$Vcsl - Vpmuxon < Vtcsl - Vtpmuxon \qquad \text{Expression 3}$$

In other words, even when the voltage of the local global input/output selection signal PMUXON is small, a write operation is not significantly affected if a voltage difference between the voltage Vpmuxon of the activated local global input/output selection signal PMUXON and the voltage Vcsl of the activated column selection signal CSL is smaller than a voltage difference between the threshold voltage Vtcsl of the bit line selection gates BLg1 and BLg2 and the threshold voltage Vtpmuxon of the local global input/output selection gates LGg1 and LGg2.

Additionally, in a low power supply voltage operation, a writing speed generally decreases. However, in embodiments described herein, during a low power supply voltage operation, a voltage difference between an internal power supply voltage mainly used in a peripheral circuit of a semiconductor memory device and an array internal power supply voltage mainly used in a memory cell array of a semiconductor memory device is less than a voltage difference between the threshold voltage Vtcsl of the bit line selection gates BLg1 and BLg2 and the threshold voltage Vtpmuxon of the local global input/output selection gates LGg1 and LGg2. Therefore, if the local global input/output selection signal PMUXON is driven by the array internal power supply voltage and the column selection signal CSL is driven by the internal power supply voltage, even though the writing speed decreases during the low power supply voltage operation, conventional problems associated with write operations performed when the local global input/output selection signal PMUXON has a low voltage level may not occur.

This feature is illustrated in Table 1. As shown in Table 1, when the local global input/output selection signal PMUXON is driven by the array internal power supply voltage and the column selection signal CSL is driven by the internal power supply voltage, the result of a simulation of the writing speed depends on the power supply voltage level. Referring to Table 1, Vint denotes an internal power supply voltage, Vinta denotes an array internal power supply voltage, and tWRITE denotes a writing speed, respectively.

TABLE 1

| Vint/Vinta(V) | 1.15/1.12 | 1.25/1.2 | 1.35/1.2 | 1.45/1.2 |
|---|---|---|---|---|
| tWRITE(ns) | 1.38 | 1.27 | 1.09 | 0.91 |

As shown in Table 1, a voltage difference between the internal power supply voltage Vint and the array internal power supply voltage Vinta increases when the power supply voltage increases. However the writing speed also increases. Thus, even when the local global input/output selection signal PMUXON is driven by the array internal power supply voltage, a write operation can be still be performed.

According to example embodiments, a voltage applied to a local global input/output gate connected between a local input/output line and a global input/output line is reduced, and transfer of a precharged voltage of the global input/output line to a bit line is prevented. Therefore, damage of the bit line can be prevented during a data masking operation.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a memory cell array having a plurality of memory cells coupled between a plurality of word lines and a plurality of bit line pairs, each memory cell of the plurality of memory cells coupled between at least one word line of the plurality of word lines and a bit line of at least one bit line pair of the plurality of bit line pairs;
   a bit line selection circuit configured to transmit data between a selected bit line pair of the plurality of bit line pairs and a local input/output line pair in response to a column selection signal;
   a local global input/output gate circuit configured to transmit data between the local input/output line pair and a global input/output line pair in response to a local global input/output selection signal; and
   a controller configured to drive the word lines, output the column selection signal having a first voltage level to the bit line selection circuit, and output the local global input/output selection signal having a second voltage level that is lower than the first voltage level to the local global input/output gate circuit, in response to an external address signal and an external command.

2. The semiconductor memory device according to claim 1, wherein the bit line selection circuit includes a plurality of bit line selection gates coupled between each of the bit line pairs and each of the local input/output line pairs, and each having a gate to which the column selection signal is applied.

3. The semiconductor memory device according to claim 2, wherein the local global input/output gate circuit includes a plurality of local global input/output gates coupled between each of the local input/output line pairs and each of the global input/output line pairs, and each having a gate to which the local global input/output selection signal is applied.

4. The semiconductor memory device according to claim 3, wherein the bit line selection gates and the local global input/output gates are transistors having a same conductivity type.

5. The semiconductor memory device according to claim 4, wherein a threshold voltage of the local global input/output gates is lower than a threshold voltage of the bit line selection gates, and a difference between the first voltage and the second voltage is smaller than a difference between the threshold voltage of the local global input/output gates and the threshold voltage of the bit line selection gates.

6. The semiconductor memory device according to claim 4, wherein the first voltage is an internal power supply voltage and the second voltage is an array internal power supply voltage.

7. The semiconductor memory device according to claim 1, further comprising:
   a precharge circuit configured to precharge the global input/output line pair to a third voltage in response to a precharge signal; and
   an input/output line driver circuit configured to drive the global input/output line pair in response to a data transfer control signal and external data during a write operation, and configured such that an output terminal is floated when the data transfer control signal is deactivated during a data masking operation.

8. The semiconductor memory device according to claim 7, wherein the controller further outputs the precharge signal and the data transfer control signal in response to the address signal and the command.

9. The semiconductor memory device according to claim 7, wherein the controller includes:

a decoder configured to decode the address signal and the command, and output a column selection control signal and a local global input/output control signal;

a column selection signal driver connected between the first voltage and a ground voltage, and configured to output the column selection signal in response to the column selection control signal; and a local global input/output selection signal driver connected between the second voltage and the ground voltage, and configured to output the local global input/output selection signal in response to the local global input/output control signal.

10. The semiconductor memory device according to claim 7, wherein the first and third voltages are internal power supply voltages and the second voltage is an array internal power supply voltage.

* * * * *